United States Patent
Yu et al.

(10) Patent No.: US 11,568,949 B2
(45) Date of Patent: Jan. 31, 2023

(54) SEMICONDUCTOR PACKAGE TEST METHOD, SEMICONDUCTOR PACKAGE TEST DEVICE AND SEMICONDUCTOR PACKAGE

(71) Applicant: Samsung Electronics Co., Ltd., Suwon-si (KR)

(72) Inventors: Hyungsuk Yu, Seoul (KR); Hyukje Kwon, Seoul (KR); Jisoo Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 4 days.

(21) Appl. No.: 17/018,418

(22) Filed: Sep. 11, 2020

(65) Prior Publication Data

US 2021/0265000 A1    Aug. 26, 2021

(30) Foreign Application Priority Data

Feb. 24, 2020  (KR) .................... 10-2020-0022380

(51) Int. Cl.
　　*G01R 31/28*　　(2006.01)
　　*G11C 29/12*　　(2006.01)
(52) U.S. Cl.
　　CPC ...... *G11C 29/1201* (2013.01); *G01R 31/2856* (2013.01); *G01R 31/2896* (2013.01)
(58) Field of Classification Search
None
See application file for complete search history.

(56) References Cited

U.S. PATENT DOCUMENTS

| | | | |
|---|---|---|---|
| 7,368,933 B2 | 5/2008 | Sim et al. | |
| 7,541,612 B2 | 6/2009 | Han | |
| 8,378,698 B2 | 2/2013 | Choi et al. | |
| 8,648,339 B2 * | 2/2014 | Koyama | G01R 31/2644 257/E23.179 |
| 8,916,875 B2 * | 12/2014 | Lee | H01L 25/03 257/686 |
| 9,396,765 B2 * | 7/2016 | Park | G11C 5/025 |

(Continued)

FOREIGN PATENT DOCUMENTS

| | | | | |
|---|---|---|---|---|
| JP | 2011075334 A | | 4/2011 | |
| KR | 20050028740 A | * | 3/2005 | ............. H01L 22/34 |

(Continued)

OTHER PUBLICATIONS

Harold Hotelling, "Some improvements in weighing and other experimental techniques," The Annals of Mathematical Statistics, vol. 15, No. 3 (1944), pp. 297-306, doi: 10.1214/aoms/1177731236 (11 pages).

*Primary Examiner* — Jermele M Hollington
(74) *Attorney, Agent, or Firm* — Muir Patent Law, PLLC

(57) ABSTRACT

A method of testing a semiconductor package including a plurality of semiconductor chips includes sensing electrical signals respectively output from a plurality of semiconductor chip groups each representing a combination of at least two semiconductor chips among the plurality of semiconductor chips, obtaining amplitudes of electrical signals respectively output from the plurality of semiconductor chips based on the plurality of sensed electrical signals, and outputting a test result for the semiconductor package by using the plurality of obtained electrical signals.

17 Claims, 12 Drawing Sheets

(56) References Cited

U.S. PATENT DOCUMENTS

| | | | |
|---|---|---|---|
| 9,720,039 B2* | 8/2017 | Whetsel | G01R 31/318558 |
| 9,892,764 B2 | 2/2018 | Kim | |
| 10,001,525 B2* | 6/2018 | Kang | G01R 31/31703 |
| 10,101,365 B2 | 10/2018 | Nakata | |
| 10,318,211 B2 | 6/2019 | Kim | |
| 2008/0094086 A1* | 4/2008 | Kim | G01R 1/0483 |
| | | | 324/762.01 |
| 2010/0191900 A1 | 7/2010 | Park | |
| 2012/0150478 A1* | 6/2012 | Song | G01R 31/31908 |
| | | | 702/123 |
| 2014/0332812 A1 | 11/2014 | Kang et al. | |
| 2017/0074937 A1* | 3/2017 | Whetsel | G01R 31/31724 |
| 2018/0287572 A1 | 10/2018 | Oishi | |
| 2019/0088290 A1 | 3/2019 | Moon | |
| 2020/0049767 A1* | 2/2020 | Kim | G01R 31/31725 |

FOREIGN PATENT DOCUMENTS

| | | |
|---|---|---|
| KR | 101005997 B1 | 1/2011 |
| KR | 1020170034166 A | 3/2017 |

\* cited by examiner

FIG. 11

| Combination | Reference Value |
|---|---|
| Comb_1 (Chip 1, Chip 2) | RV_1 |
| Comb_2 (Chip 2, Chip 3) | RV_2 |
| ⋮ | ⋮ |
| Comb_M (Chip N, Chip 1) | RV_M |

TABLE_Ref

FIG. 12

START

PROVIDE CER COMMAND TO SEMICONDUCTOR PACKAGE — S320

PROVIDE ADDRESS SIGNALS CORRESPONDING TO SEMICONDUCTOR CHIPS INCLUDED IN SEMICONDUCTOR CHIP GROUP TO SEMICONDUCTOR PACKAGE — S340

SENSE ELECTRICAL SIGNALS OUTPUT FROM SEMICONDUCTOR CHIPS CORRESPONDING TO SEMICONDUCTOR CHIP GROUP — S360

END

SEMICONDUCTOR PACKAGE TEST METHOD, SEMICONDUCTOR PACKAGE TEST DEVICE AND SEMICONDUCTOR PACKAGE

CROSS-REFERENCE TO RELATED APPLICATION

This application claims the benefit of priority under 35 U.S.C. § 119 to Korean Patent Application No. 10-2020-0022380, filed on Feb. 24, 2020, in the Korean Intellectual Property Office, the disclosure of which is incorporated herein in its entirety by reference.

BACKGROUND

The inventive concept relates to a semiconductor package test method, a semiconductor package test device, and a semiconductor package, and more particularly, to a semiconductor package including a plurality of semiconductor chips and semiconductor package test device and method for testing the same.

As the plurality of semiconductor chips are mounted in an electronic device, a configuration of hardware becomes complicated. In addition, as the electronic device is required to be small and light, in order to reduce the number of mounted parts, a semiconductor package, such as a multi-chip package in which a plurality of semiconductor chips are mounted in one package, is provided.

In addition, as the electronic device is highly functional, a test for the semiconductor package included in the electronic device also becomes complicated. For this purpose, equipment for testing the semiconductor package is enlarged and a technology for correctly testing the semiconductor package including the plurality of semiconductor chips is required.

SUMMARY

The inventive concept relates to a semiconductor package test method, a semiconductor package test device, and a semiconductor package capable of reducing a measurement error for electrical signals (for example, currents) output from a plurality of semiconductor chips, which is accompanied by a test for a semiconductor package.

According to an aspect of the inventive concept, there is provided a method of testing a semiconductor package including a plurality of semiconductor chips. The method includes sensing a plurality of electrical signals respectively output from a plurality of semiconductor chip groups, each of the plurality of semiconductor chip groups representing a combination of at least two semiconductor chips among the plurality of semiconductor chips, obtaining amplitudes of a plurality of electrical signals respectively output from the plurality of semiconductor chips based on the plurality of sensed electrical signals, and outputting a test result for the semiconductor package by using the plurality of obtained electrical signals.

According to an aspect of the inventive concept, there is provided a method of testing a semiconductor package including a plurality of semiconductor chips. The method includes sensing a plurality of electrical signals respectively output from a plurality of semiconductor chip groups, each of the plurality of semiconductor chip groups representing a combination of at least two semiconductor chips among the plurality of semiconductor chips, comparing the plurality of sensed electrical signals with a reference table including reference values corresponding to a plurality of semiconductor chip combinations, and outputting a test result for the semiconductor package based on a comparison result of the comparing of the plurality of sensed electrical signals with the reference table.

According to an aspect of the inventive concept, there is provided a device for testing a semiconductor package including a plurality of semiconductor chips. The device includes a receiver circuit configured to receive electrical signals respectively output from a plurality of semiconductor chip groups formed of an arbitrary combination of the plurality of semiconductor chips, an arithmetic circuit configured to obtain amplitudes of electrical signals respectively output from the plurality of semiconductor chips by performing an operation using the electrical signals received by the receiver circuit, and a determination circuit configured to determine a fault of the semiconductor package based on the amplitudes of the electrical signals obtained by the arithmetic circuit.

According to an aspect of the inventive concept, there is provided a semiconductor package including a plurality of semiconductor chips sharing one channel and a control circuit configured to receive a Chip Enable Reduction (CER) command to simultaneously select at least two semiconductor chips, receive a plurality of address signal corresponding to semiconductor chips from the plurality of semiconductor chips, and control the semiconductor chips in response to the CER command, where the CER command is received from the outside of the semiconductor package is received from the outside of the semiconductor package device. The semiconductor package is configured to output a sum of currents output from the selected semiconductor chips through the one channel.

According to an aspect of the inventive concept, there is provided a method of operating a semiconductor package including a plurality of semiconductor chips. The method includes receiving a first command from outside of the semiconductor package, receiving a plurality of address signals subsequent to receiving the first command, and outputting an electrical signal obtained by combining electrical signals output from selected semiconductor chips corresponding to the plurality of address signals among the plurality of semiconductor chips through a channel shared by the plurality of semiconductor chips.

According to an aspect of the inventive concept, there is provided a method of testing a semiconductor package including a plurality of semiconductor chips. The method includes iteratively performing an operation of sensing a value of a current output from a semiconductor chip group formed of an arbitrary combination of the plurality of semiconductor chips on a plurality of semiconductor chip groups and determining whether the semiconductor package is defective based on the sensed value of the current output from the semiconductor chip group. The operation of sensing the value of the current output from the semiconductor chip group includes providing a CER command instructing that at least two semiconductor chips of the plurality of semiconductor chips be activated to the semiconductor package, providing address signals corresponding to first semiconductor chips included in the semiconductor chip group to the semiconductor package, and sensing a sum of currents output from the first semiconductor chips.

BRIEF DESCRIPTION OF THE DRAWINGS

Embodiments of the inventive concept will be more clearly understood from the following detailed description taken in conjunction with the accompanying drawings in which like numbers represent like elements throughout. In the drawings:

FIG. 11 illustrates a reference table, according to an exemplary embodiment of the inventive concept;

FIG. 12 is a flowchart of a semiconductor package test method, according to an exemplary embodiment of the inventive concept;

DETAILED DESCRIPTION OF THE EMBODIMENTS

Hereinafter, embodiments of the inventive concept will be described in detail with reference to the accompanying drawings.

Figure 1:
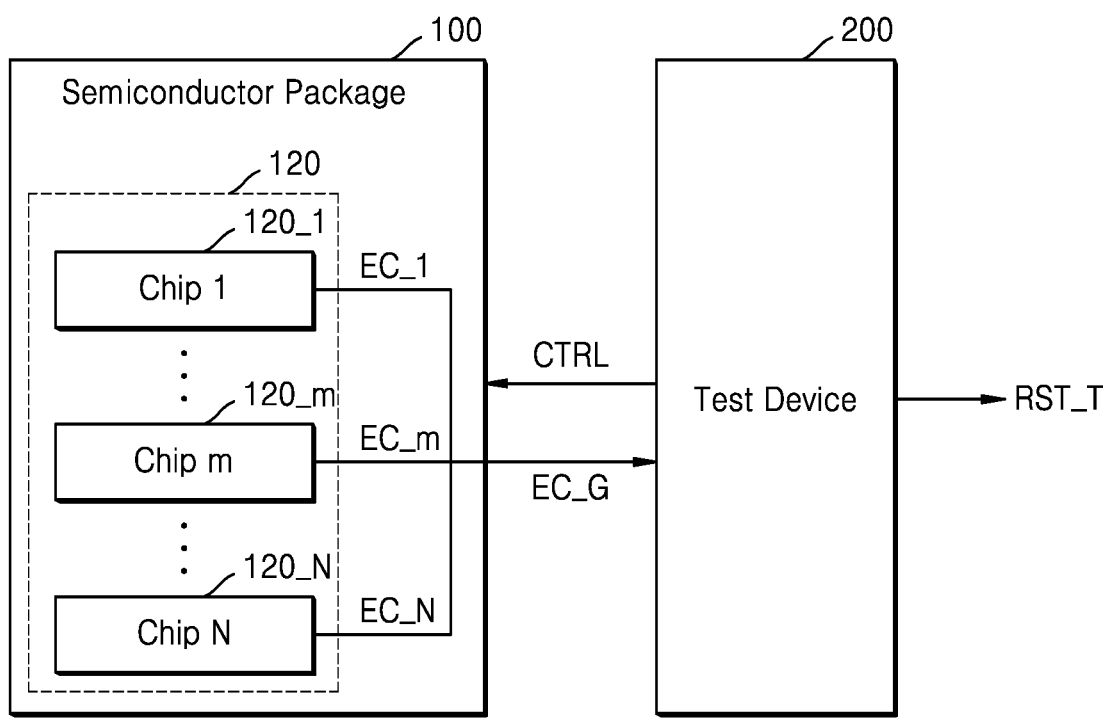
FIG. 1 illustrates a semiconductor package test system, according to an exemplary embodiment of the inventive concept.

FIG. 1 illustrates a semiconductor package test system 10 according to an exemplary embodiment of the inventive concept. The semiconductor package test system 10 may include a semiconductor package 100 and a test device 200.

The semiconductor package 100 may include a plurality of semiconductor chips. In an example embodiment, the plurality of semiconductor chips may be stacked on a package substrate and may be mounted in the semiconductor package 100. The semiconductor package 100 may be used in each of various electronic devices and electronic systems such as, for example, a computer, a laptop computer, a cellular phone, a smart phone, an MP3 player, a personal digital assistant (PDA), a portable multimedia player (PMP), a digital TV, a digital camera, a portable game console, a navigator, a wearable device, an Internet of things (IoT) device, an Internet of everything (IoE) device, an e-book, a virtual reality (VR) device, an augmented reality (AR) device, etc. In an example embodiment, the semiconductor package 100 may be implemented by a non-volatile memory package, as described in detail with reference to FIGS. 15 and 16.

The semiconductor package 100 may include N semiconductor chips 120 (N is a natural number of no less than 2), for example, first to Nth semiconductor chips 120_1 to 120_N. In addition, in an example embodiment, the first to Nth semiconductor chips 120_1 to 120_N may share one channel. Alternatively, in an embodiment, at least two of the first to Nth semiconductor chips 120_1 to 120_N may share one channel. As used herein, the term "channel" may refer to a physical transmission medium over which data or information signals can be sent by one or more senders and received by one or more receivers.

The test device 200 may test the semiconductor package 100. For example, after the semiconductor package 100 is manufactured, the test device 200 may determine whether the semiconductor package 100 is defective. However, the inventive concept is not limited thereto. During processes of manufacturing the semiconductor package 100, the test device 200 may determine whether the semiconductor package 100 is defective. FIG. 1 illustrates an embodiment in which the test device 200 is separate from the semiconductor package 100. However, the inventive concept is not limited thereto. In some cases, the test device 200 or a test circuit performing the same function as the test device 200 may be implemented in the semiconductor package 100.

The test device 200 may provide a control signal CTRL to the semiconductor package 100. For example, the test device 200 may transmit the control signal CTRL to the semiconductor package 100 via a channel shared by the first to Nth semiconductor chips 120_1 to 120_N. As described with reference to the following drawings, the control signal CTRL may include a command controlling an operation of the semiconductor package 100 and an address signal selecting at least one semiconductor chip from the plurality of semiconductor chips. In addition, the command may include a chip enable reduction (CER) command simultaneously activating at least two semiconductor chips among the plurality of semiconductor chips.

The semiconductor package 100 according to an exemplary embodiment of the inventive concept may activate at least one semiconductor chip among the plurality of semiconductor chips, based on the control signal CTRL provided by the test device 200. In particular, in an example embodiment, in response to the CER command instructing that the at least two semiconductor chips be activated, the semiconductor package 100 may activate the at least two semiconductor chips and may output a group electrical signal EC_G obtained by summing up electrical signals output from a semiconductor chip group including the at least two activated semiconductor chips. The semiconductor package 100 may provide the group electrical signal EC_G to the test device 200. For example, the test device 200 may sense the group electrical signal EC_G output from the semiconductor package 100. Here, the electrical signal may include a current or a voltage. However, the inventive concept is not limited thereto. The electrical signal may include various kinds of electrical signals output from the semiconductor chips.

As a non-limiting example for convenience sake, based on the control signal CTRL received from the test device 200, the semiconductor package 100 may activate a first semiconductor chip 120_1, an mth semiconductor chip 120_*m* (m is a natural number of no less than 2), and the Nth semiconductor chip 120_N. The first semiconductor chip 120_1 may output a first electrical signal EC_1, the mth semiconductor chip 120_*m* may output an mth electrical signal EC_m, and the Nth semiconductor chip 120_N may output an Nth electrical signal EC_N. The semiconductor package 100 may output the group electrical signal EC_G obtained by summing up the first electrical signal EC_1, the mth electrical signal EC_m, and the Nth electrical signal EC_N, and may provide the group electrical signal EC_G to the test device 200. For example, the semiconductor package 100 may output the group electrical signal EC_G through a channel shared by the first to Nth semiconductor chips 120_1 to 120_N.

An operation of simultaneously activating the first semiconductor chip 120_1, the mth semiconductor chip 120_*m*, and the Nth semiconductor chip 120_N, and outputting the group electrical signal EC_G may be performed in one operation sequence. The semiconductor package 100 may repeatedly perform such an operation sequence while changing a semiconductor chip combination. For example, the semiconductor package 100 may perform the operation sequence N times.

For example, in one operation sequence, the semiconductor chip group including a combination of at least two semiconductor chips of the first to Nth semiconductor chips 120_1 to 120_N may be determined, and the test device 200 may sense the group electrical signal EC_G output from the determined semiconductor chip group. The operation sequence may be performed N times on semiconductor chip groups including various semiconductor chip combinations. Each semiconductor chip group may output a group electrical signal EC_G.

The test device 200 may test the semiconductor package 100 by using the group electrical signals EC_G received through a plurality of operation sequences performed on a plurality of semiconductor chip groups. The test device 200 may generate a test result RST_T by testing the semiconductor package 100 and may output the test result RST_T to the outside. For example, the test device 200 may test whether the semiconductor package 100 is defective. In addition, for example, the test device 200 may output the test result RST_T at a first logic level when the semiconductor package 100 is defective or may output the test result RST_T at a second logic level when the semiconductor package 100 is not defective, the second logic level being different from the first logic level.

In an example embodiment, the test device 200 may obtain amplitudes of electrical signals output from the plurality of semiconductor chips by performing an operation by using a plurality of group electrical signals EC_G corresponding to a plurality of operation sequences. The test device 200 may output the test result RST_T by testing the semiconductor package 100 based on the obtained amplitudes of the electrical signals. The example embodiment will be described in more detail with reference to FIGS. 2 to 8.

In addition, in an example embodiment, the test device 200 may test the semiconductor package 100 by comparing the plurality of group electrical signals EC_G corresponding to the plurality of sequences with a reference table. The reference table may include reference values corresponding to the various semiconductor chip combinations. The embodiment will be described in more detail with reference to FIGS. 9 to 11.

In the semiconductor package test system 10 according to an exemplary embodiment of the inventive concept, the test device 200 may simultaneously sense electrical signals output from the at least two combined semiconductor chips 120 from the plurality of semiconductor chips 120. Therefore, a sensing error with the electrical signals output from the plurality of semiconductor chips 120, which is accompanied by the test, may be reduced.

In addition, in a semiconductor package having a structure in which a plurality of semiconductor chips 120 share one channel, in a comparative example in which a test device senses an electrical signal output from one activated semiconductor chip, an error occurs with an electrical signal generated by a leakage current output from inactivated semiconductor chips. However, in the semiconductor package test system 10 according to an exemplary embodiment of the inventive concept, by simultaneously sensing the electrical signals output from the at least two activated semiconductor chips 120, the sensing error with the electrical signal generated by the leakage current output from the non-selected (inactivated) semiconductor chip 120 may be reduced.

As described above, as the sensing error with the electrical signal is reduced, the reliability of the test for the semiconductor package 100 may increase.

Figure 2:
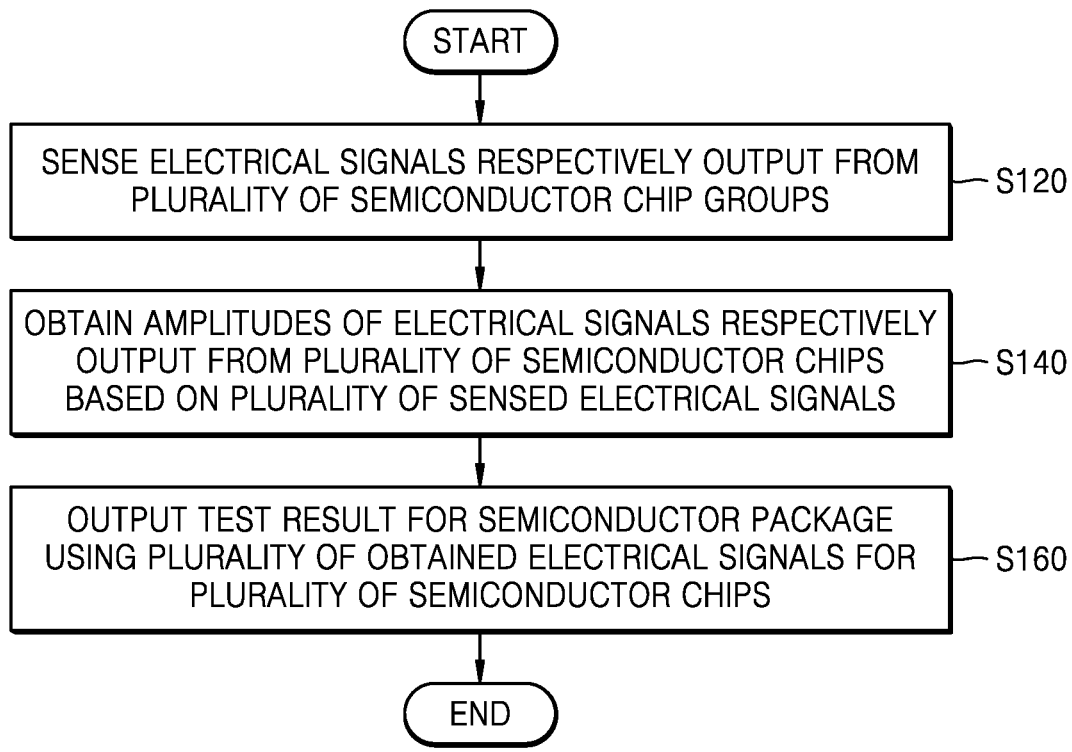
FIG. 2 is a flowchart of a semiconductor package test method, according to an exemplary embodiment of the inventive concept.

FIG. 2 is a flowchart of a semiconductor package test method according to an exemplary embodiment of the inventive concept. FIG. 2 is described with reference to FIG. 1.

The test device 200 may sense group electrical signals EC_G respectively output from the plurality of semiconductor chip groups of the semiconductor package 100 in operation S120. Each of the plurality of semiconductor chip groups may represent the combination of at least two semiconductor chips 120 among the plurality of semiconductor chips 120. For example, in a first operation sequence, the test device 200 may sense the group electrical signal EC_G output from a first semiconductor chip group corresponding to a first semiconductor chip combination. In some embodiments, in a second operation sequence, the test device 200 may sense the group electrical signal EC_G output from a second semiconductor chip group corresponding to a second semiconductor chip combination. Such an operation sequence may be repeated M times (M is a natural number of no less than 2). Here, M may be equal to N that is the number of semiconductor chips 120.

The test device 200 may obtain the amplitudes of the electrical signals respectively output from the plurality of semiconductor chips 120 based on the plurality of sensed group electrical signals EC_G in operation S140. For example, the test device 200 may obtain the amplitudes of the electrical signals respectively output from each of the plurality of semiconductor chips 120 using the plurality of group electrical signals EC_G sensed in the plurality of operation sequences of operation S120. In an example embodiment, the test device 200 may obtain the amplitudes of the electrical signals respectively output from each of the plurality of semiconductor chips 120 by obtaining a solution of a simultaneous equation determined based on the plurality of sensed group electrical signals EC_G and a combination of semiconductor chips 120 included in the plurality of semiconductor chip groups. In an example embodiment, the test device 200 may use addition, subtraction, and division operations like in the embodiment described with reference to FIGS. 5 to 7. In addition, in an example embodiment, the test device 200 may use a matrix operation like in the embodiment described with reference to FIG. 8.

The test device 200 may output the test result RST_T for the semiconductor package 100 by using the plurality of electrical signals obtained for the plurality of semiconductor chips 120 in operation S160. For example, the test device 200 may compare the amplitudes of the plurality of electrical signals (e.g., the amplitudes of electrical signals EC_1 to EC_N) obtained for the plurality of semiconductor chips 120 (e.g., semiconductor chips 120_1 to 120_N) with a predetermined reference value, and may output the test result RST_T representing that the semiconductor package 100 is not defective when the amplitudes of each of the plurality of electrical signals obtained by the plurality of semiconductor chips 120 have values in an error range predetermined from the predetermined reference value. To the contrary, when amplitudes of one or more of the electrical signals among the plurality of electrical signals obtained for the plurality of semiconductor chips 120 deviate from the error range predetermined from the predetermined reference value, the test device 200 may output the test result RST_T representing that the semiconductor package 100 is defective.

Figure 3:
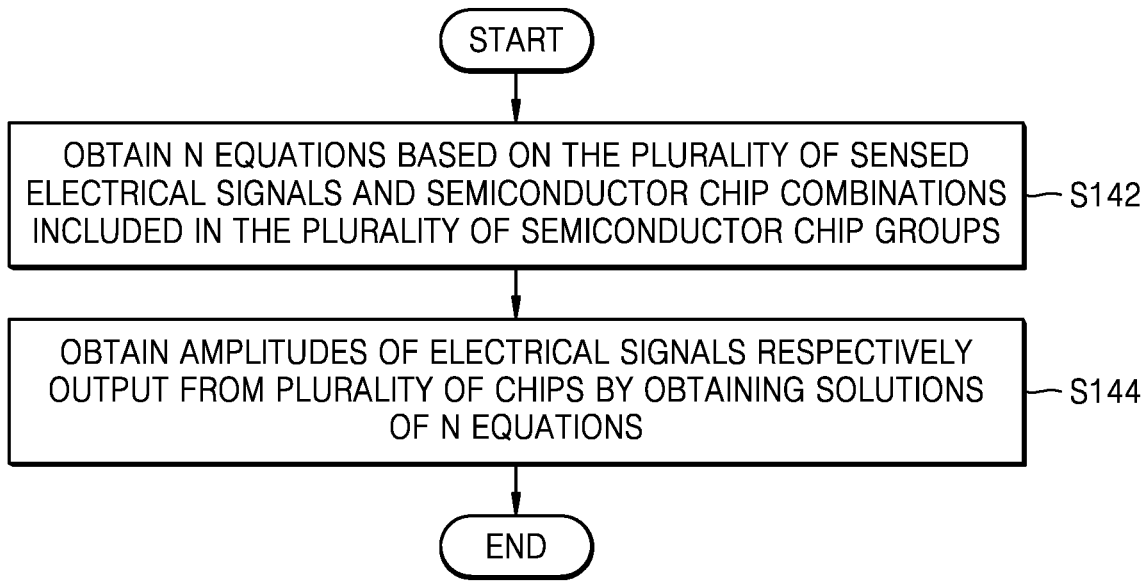
FIG. 3 is a flowchart of a semiconductor package test method, according to an exemplary embodiment of the inventive concept.

FIG. 3 is a flowchart of a semiconductor package test method according to an exemplary embodiment of the inventive concept. FIG. 3 is a flowchart particularly illustrating an embodiment of operation S140 of FIG. 2. FIG. 3 is described with reference to FIG. 1.

The test device 200 may obtain N equations based on the plurality of group electrical signals EC_G sensed in the plurality of operation sequences and the semiconductor chip combinations included in the plurality of semiconductor chip groups through operation S120 of FIG. 2 in operation S142. For example, unknowns of the N equations may be the amplitudes of the electrical signals EC_1 to EC_N respectively output from the first to Nth semiconductor chips 120_1 to 120_N, coefficients multiplied with the unknowns may be determined based on the semiconductor chip combinations included in the plurality of semiconductor chip groups, and constants of the N equations may be determined based on the plurality of sensed group electrical signals EC_G.

Figure 8:
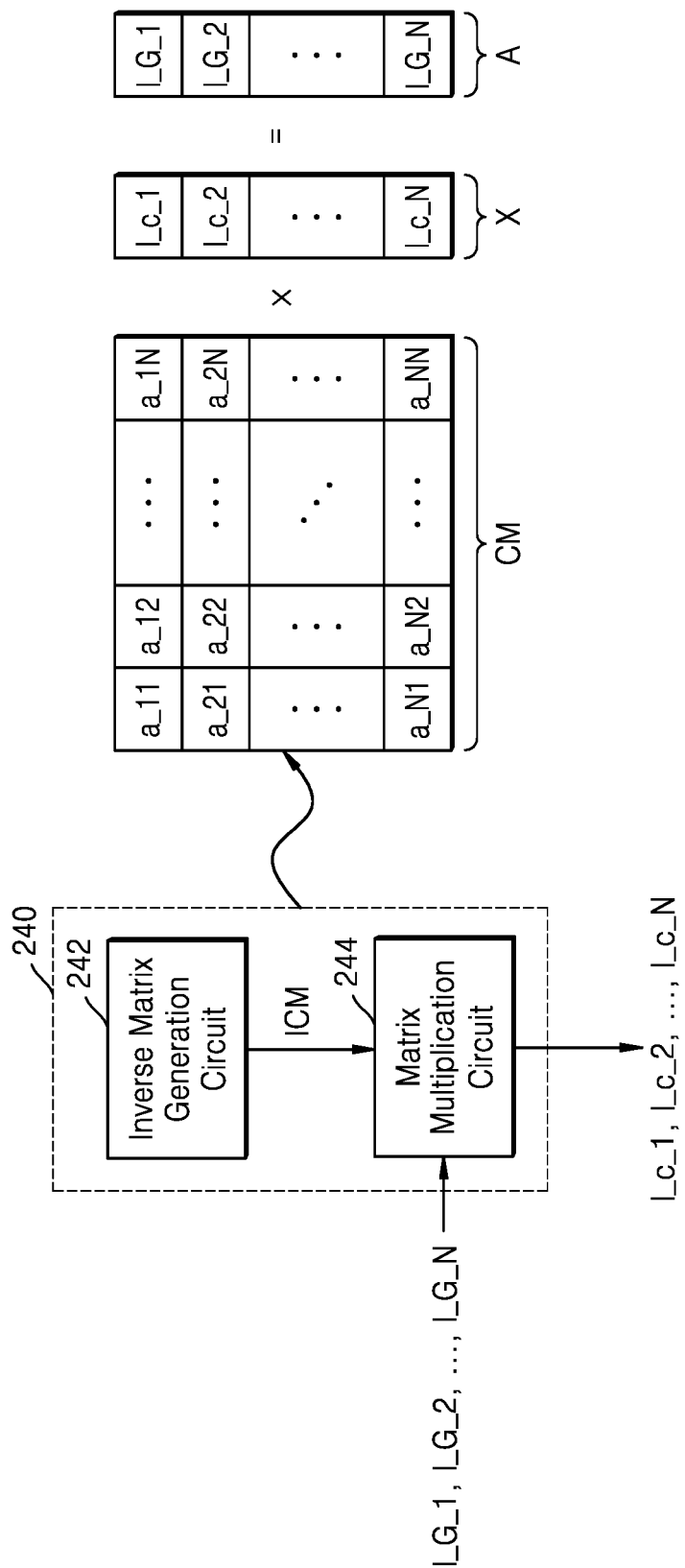
FIG. 8 illustrates an arithmetic circuit, according to an exemplary embodiment of the inventive concept.

The test device 200 may obtain the amplitudes of the electrical signals EC_1 to EC_N respectively output from the plurality of semiconductor chips 120_1 to 120_N by obtaining solutions of the obtained N equations in operation S144. For this purpose, in an example embodiment, the test device 200 may include an arithmetic circuit (arithmetic circuit 240 of FIG. 4). In addition, in an example embodiment, the test device 200 may obtain the solution of the simultaneous equation including the N equations through the matrix operation as illustrated in FIG. 8.

Figure 4:
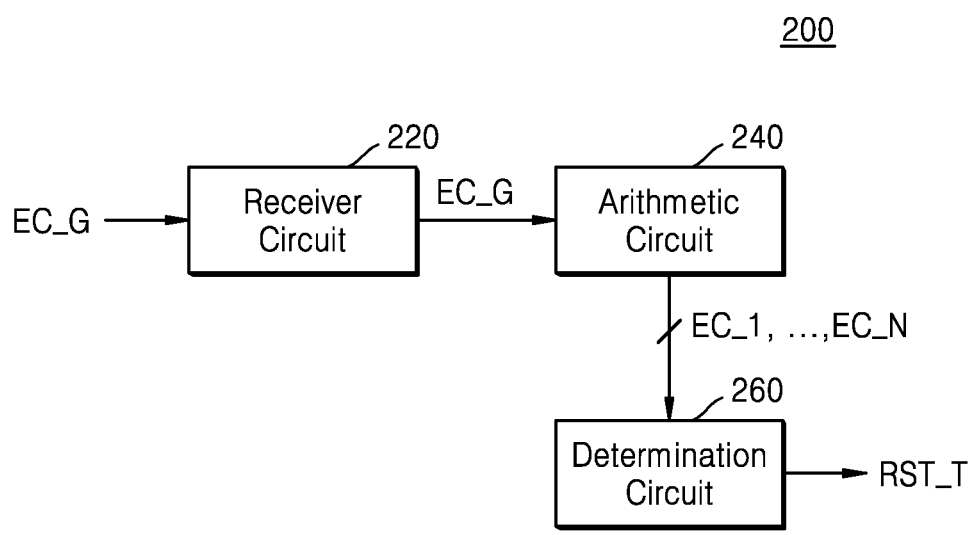
FIG. 4 illustrates a test device, according to an exemplary embodiment of the inventive concept.

FIG. 4 illustrates the test device 200 according to an exemplary embodiment of the inventive concept. The test device 200 may correspond to the test device 200 of FIG. 1. FIG. 4 is described with reference to FIG. 1.

The test device 200 may include a receiver circuit 220, the arithmetic circuit 240, and a determination circuit 260.

The receiver circuit 220 may receive the group electrical signal EC_G from the outside of the test device 200. For example, the receiver circuit 220 may receive the group electrical signal EC_G from the semiconductor package 100 and may transmit the group electrical signal EC_G to the arithmetic circuit 240. For example, the receiver circuit 220 may be implemented by one of various forms of interfaces receiving the group electrical signal EC_G.

The arithmetic circuit 240 may receive the group electrical signal EC_G through the receiver circuit 220. The arithmetic circuit 240 may obtain the electrical signals output from the plurality of semiconductor chips 120_1 to 120_N by performing the operation by using the group electrical signals EC_G received through the plurality of operation sequences. For example, the arithmetic circuit 240 may obtain a first electrical signal EC_1 output from the first semiconductor chip 120_1 by performing the operation using a plurality of group electrical signals EC_G, and may obtain an Nth electrical signal EC_N output from the Nth semiconductor chip 120_N by performing the operation using the plurality of group electrical signals EC_G by the same method. Here, obtaining the electrical signal may mean 'obtaining the amplitude of the electrical signal'. For example, the semiconductor chips 120_1 to 120_N may respectively output electrical signals EC_1 to EC_N, and the arithmetic circuit 240 may determine the amplitudes of the individual electrical signals EC_1 to EC_N. The arithmetic circuit 240 may provide the obtained amplitudes of the first to Nth electrical signals EC_1 to EC_N to the determination circuit 260.

The arithmetic circuit 240 may be implemented in various forms. In an embodiment, the arithmetic circuit 240 may be implemented in the form of hardware or software. When the arithmetic circuit 240 is implemented in the form of hardware, the arithmetic circuit 240 may include circuits obtaining the amplitudes of the electrical signals respectively output from the plurality of semiconductor chips based on the electrical signals received from the plurality of operation sequences. In addition, for example, when the arithmetic circuit 240 is implemented in the form of software, a program and/or instructions loaded on memory in the test device 200 are executed by a processor in the test device 200 so that an operation of the arithmetic circuit 240 may be performed. However, the inventive concept is not limited to the above embodiments and the arithmetic circuit 240 may be implemented in the form of a combination of software and hardware like firmware.

Detailed operation methods of the arithmetic circuit 240 will be described in more detail with reference to the following drawings.

The determination circuit 260 may test the semiconductor package 100 based on the amplitudes of the electrical signals EC_1 to EC_N output from the plurality of semiconductor chips 120_1 to 120_N provided to the determination circuit 260 by the arithmetic circuit 240. For example, the determination circuit 260 may determine whether the semiconductor package 100 or at least one of the plurality of semiconductor chips 120 included therein is defective based on the amplitudes of the electrical signals EC_1 to EC_N output from the plurality of semiconductor chips 120_1 to 120_N. The determination circuit 260 may output the test result RST_T by testing the semiconductor package 100. For example, the determination circuit 260 may output the test result RST_T at the first logic level when the semiconductor package 100 is defective and may output the test result RST_T at the second logic level when the semiconductor package 100 is not defective. Here, the first logic level may indicate that the semiconductor package 100 is defective and the second logic level may indicate that the semiconductor package 100 is not defective.

The determination circuit 260 may be implemented in one of various forms. In an embodiment, the determination circuit 260 may be implemented in the form of hardware and/or software. When the determination circuit 260 is implemented in the form of hardware, the determination circuit 260 may include circuits determining whether the semiconductor package 100 is defective based on the plurality of obtained electrical signals EC_1, . . . , and EC_N. In addition, for example, when the determination circuit 260 is implemented in the form of software, a program and/or instructions loaded on memory in the test device 200 are executed by a processor in the test device 200 so that an operation of the determination circuit 260 may be performed. However, the inventive concept is not limited to the above embodiments, and the determination circuit 260 may be implemented in the form of a combination of software and hardware like firmware.

A semiconductor package test method will be described in more detail with reference to the following drawings.

Figure 5:
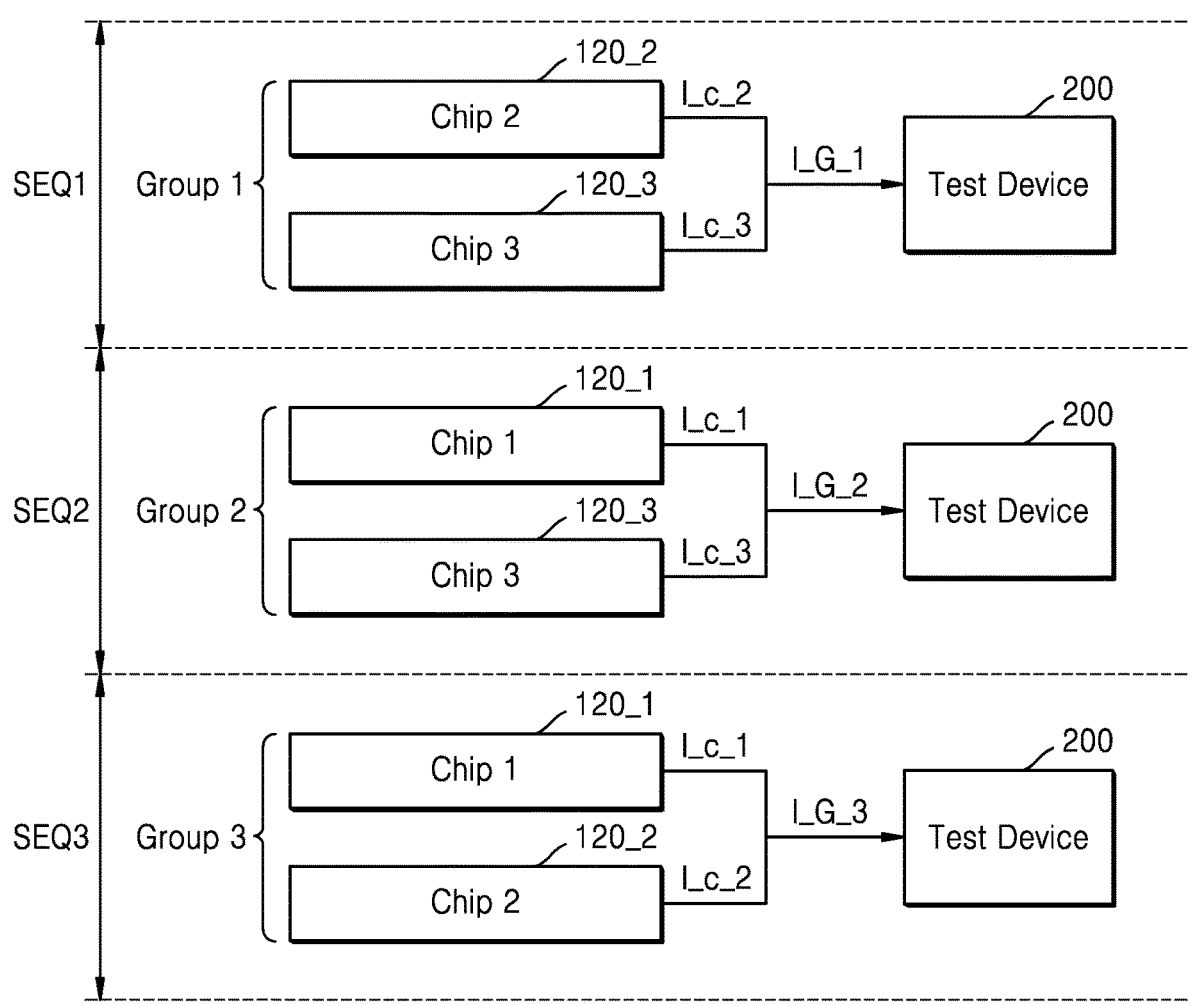
FIG. 5 is a view illustrating an example of a semiconductor package test method, according to an exemplary embodiment of the inventive concept.

FIG. 5 is a view illustrating an example of a semiconductor package test method according to an exemplary embodiment of the inventive concept. In particular, FIG. 5 is a view exemplarily illustrating an embodiment in which three semiconductor chips share one channel in a semiconductor package. In particular, FIG. 5 illustrates an embodiment in which an electrical signal is a current among the previously described embodiments. However, the inventive concept is not limited thereto. FIG. 5 is described with reference to FIGS. 1 and 4.

The test device 200 may test the semiconductor package 100 through the plurality of operation sequences. For example, the test device 200 may perform operations of a first operation sequence SEQ 1, a second operation sequence SEQ 2, and a third operation sequence SEQ 3. In an ith operation sequence (in this example, i is 1, 2, or 3), the test device 200 may sense a group current output from an ith semiconductor chip group (e.g., Group 1, Group 2, or Group 3). Here, the ith semiconductor chip group may include semiconductor chips excluding an ith semiconductor chip among the plurality of semiconductor chips 120_1, 120_2, and 120_3. For example, each of the semiconductor groups Group 1, Group 2, and Group 3 may include all but one of the semiconductor chips 120_1, 120_2, or 120_3.

In a detailed example, in the first operation sequence SEQ 1, the semiconductor package 100 may output a first group current $I\_G\_1$ that is the sum of currents output from a second semiconductor chip 120_2 and a third semiconductor chip 120_3 included in the first semiconductor chip group Group 1. For example, the first group current $I\_G\_1$ obtained by summing up a second chip current $I\_c\_2$ output from the second semiconductor chip 120_2 and a third chip current $I\_c\_3$ output from the third semiconductor chip 120_3 may be provided to the test device 200.

In the second operation sequence SEQ 2, the semiconductor package 100 may output a second group current $I\_G\_2$ that is the sum of currents output from the first semiconductor chip 120_1 and the third semiconductor chip 120_3 included in the second semiconductor chip group Group 2. For example, the second group current $I\_G\_2$ obtained by summing up the first chip current $I\_c\_1$ output from the first semiconductor chip 120_1 and the third chip current $I\_c\_3$ output from the third semiconductor chip 120_3 may be provided to the test device 200.

In the third operation sequence SEQ 3, the semiconductor package 100 may output a third group current $I\_G\_3$ that is the sum of currents output from the first semiconductor chip 120_1 and the second semiconductor chip 120_2 included in a third semiconductor chip group Group 3. For example, the third group current $I\_G\_3$ obtained by summing up the first chip current $I\_c\_1$ output from the first semiconductor chip 120_1 and the second chip current $I\_c\_2$ output from the second semiconductor chip 120_2 may be provided to the test device 200.

After the first to third operation sequences SEQ 1 to SEQ 3 are completed, the test device 200 may test the semiconductor package 100 based on the first group current $I\_G\_1$, the second group current $I\_G\_2$, and the third group current $I\_G\_3$. For example, the test device 200 may obtain the first chip current $I\_c\_1$, the second chip current $I\_c\_2$, and the third chip current $I\_c\_3$ by using the first group current $I\_G\_1$, the second group current $I\_G\_2$, and the third group current $I\_G\_3$, and may test the semiconductor package 100 based on the amplitudes of the obtained chip currents. The test device 200 may obtain the first chip current $I\_c\_1$, the second chip current $I\_c\_2$, and the third chip current $I\_c\_3$ by obtaining the solution of the simultaneous equation determined based on the first group current $I\_G\_1$, the second group current $I\_G\_2$, and the third group current $I\_G\_3$ and the semiconductor chip combinations included in the semiconductor chip groups. For example, the test device 200 may obtain the chip currents by obtaining the solution of the simultaneous equation like the following [EQUATION 1].

$$I\_c\_2 + I\_c\_3 = I\_G\_1$$

$$I\_c\_1 + I\_c\_3 = I\_G\_2$$

$$I\_c\_1 + I\_c\_2 = I\_G\_3 \qquad \text{[EQUATION 1]}$$

The arithmetic circuit 240 of the test device 200, which obtains the amplitudes of the chip currents, will be described in detail with reference to FIG. 6.

Figure 6:
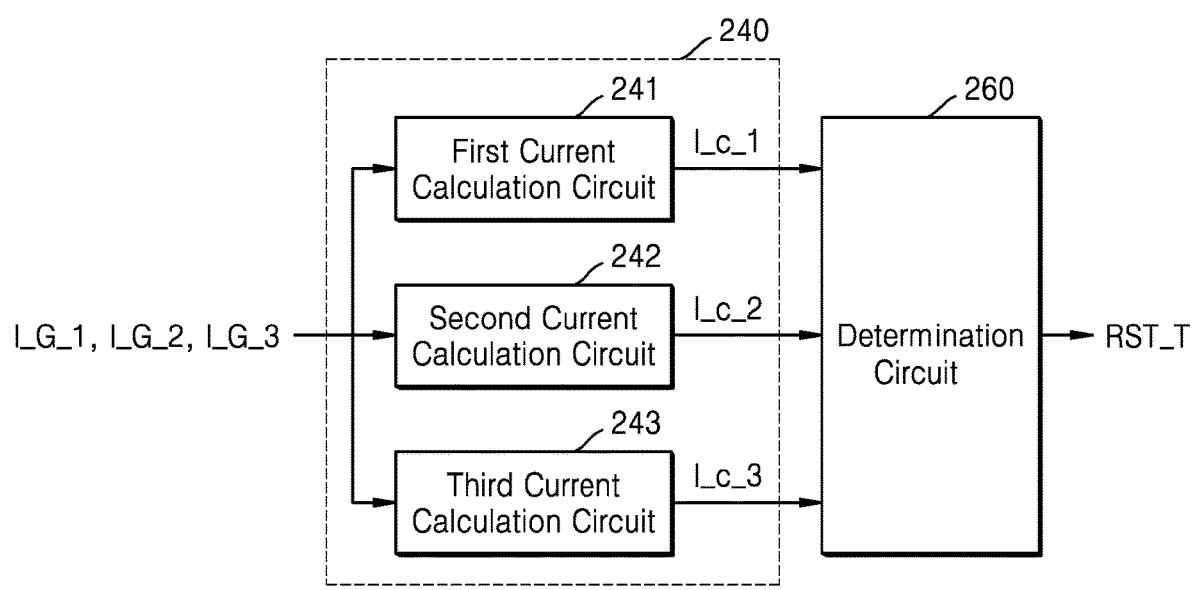
FIG. 6 illustrates an arithmetic circuit and a determination circuit, according to an exemplary embodiment of the inventive concept.

FIG. 6 illustrates the arithmetic circuit 240 and the determination circuit 260 according to an exemplary embodiment of the inventive concept. In particular, FIG. 6 illustrates an example embodiment of the test device 200 outputting the test result RST_T in the embodiment of FIG. 5. The arithmetic circuit 240 and the determination circuit 260 may correspond to the arithmetic circuit 240 and the determination circuit 260 of FIG. 4. Therefore, description previously given for the arithmetic circuit 240 and the determination circuit 260 with reference to FIG. 4 is omitted. FIG. 6 is described with reference to FIG. 5.

Through the plurality of operation sequences, the arithmetic circuit 240 may sense the first group current $I\_G\_1$, the second group current $I\_G\_2$, and the third group current $I\_G\_3$ from the semiconductor package 100. The arithmetic circuit 240 may obtain the first chip current $I\_c\_1$, the second chip current $I\_c\_2$, and the third chip current $I\_c\_3$ by performing an operation using the first group current $I\_G\_1$, the second group current $I\_G\_2$, and the third group current $I\_G\_3$. For this purpose, the arithmetic circuit 240 may include a first current calculation circuit 241, a second current calculation circuit 242, and a third current calculation circuit 243.

The first current calculation circuit 241 may calculate the first chip current $I\_c\_1$ by performing the operation using the first group current $I\_G\_1$, the second group current $I\_G\_2$, and the third group current $I\_G\_3$. For example, the first current calculation circuit 241 may calculate the first chip current $I\_c\_1$ through the operation such as the following [EQUATION 2]. [EQUATION 2] may represent a result equation obtaining the solution of the simultaneous equation such as [EQUATION 1].

$$I\_c\_1 = (I\_G\_2 + I\_G\_3 - I\_G\_1)/2 \qquad \text{[EQUATION 2]}$$

For example, the first current calculation circuit 241 may calculate the first chip current $I\_c\_1$ by adding the second group current $I\_G\_2$ to the third group current $I\_G\_3$ and dividing by 2 the value obtained by subtracting the first group current $I\_G\_1$ from the sum of the second group current $I\_G\_2$ and the third group current $I\_G\_3$.

The second current calculation circuit 242 may calculate the second chip current $I\_c\_2$ by performing the operation using the first group current $I\_G\_1$, the second group current $I\_G\_2$, and the third group current $I\_G\_3$. For example, the second current calculation circuit 242 may calculate the second chip current I_c_2 through the operation such as the following [EQUATION 3]. [EQUATION 3] may represent a result equation obtaining the solution of the simultaneous equation such as [EQUATION 1].

$$I\_c\_2 = (I\_G\_1 + I\_G\_3 - I\_G\_2)/2 \qquad \text{[EQUATION 3]}$$

For example, the second current calculation circuit 242 may calculate the second chip current I_c_2 by adding the first group current I_G_1 to the third group current I_G_3 and dividing by 2 the value obtained by subtracting the second group current I_G_2 from the sum of the first group current I_G_1 and the third group current I_G_3.

In addition, the third current calculation circuit 243 may calculate the third chip current I_c_3 by performing the operation using the first group current I_G_1, the second group current I_G_2, and the third group current I_G_3. For example, the third current calculation circuit 243 may calculate the third chip current I_c_3 through the operation such as the following [EQUATION 4]. [EQUATION 4] may represent a result equation obtaining the solution of the simultaneous equation such as [EQUATION 1].

$$I\_c\_3 = (I\_G\_1 + I\_G\_2 - I\_G\_3)/2 \qquad \text{[EQUATION 4]}$$

For example, the third current calculation circuit 243 may calculate the third chip current I_c_3 by adding the first group current I_G_1 to the second group current I_G_2 and dividing by 2 the value obtained by subtracting the third group current I_G_3 from the sum of the first group current I_G_1 and the second group current I_G_2.

The determination circuit 260 may output the test result RST_T based on the first chip current I_c_1, the second chip current I_c_2, and the third chip current I_c_3 that are calculated.

According to equations such as [EQUATION 2] to [EQUATION 4], when a measurement error for each current is referred to as a, an error for each of the chip currents is ¾ a, which is because an error is statistically similar to variance of a variable in each equation. For example, in comparison with a comparative example in which the respective chip currents are sensed, by sensing the sum of the currents output from the plurality of semiconductor chips, the sensing error may be reduced.

Figure 7:
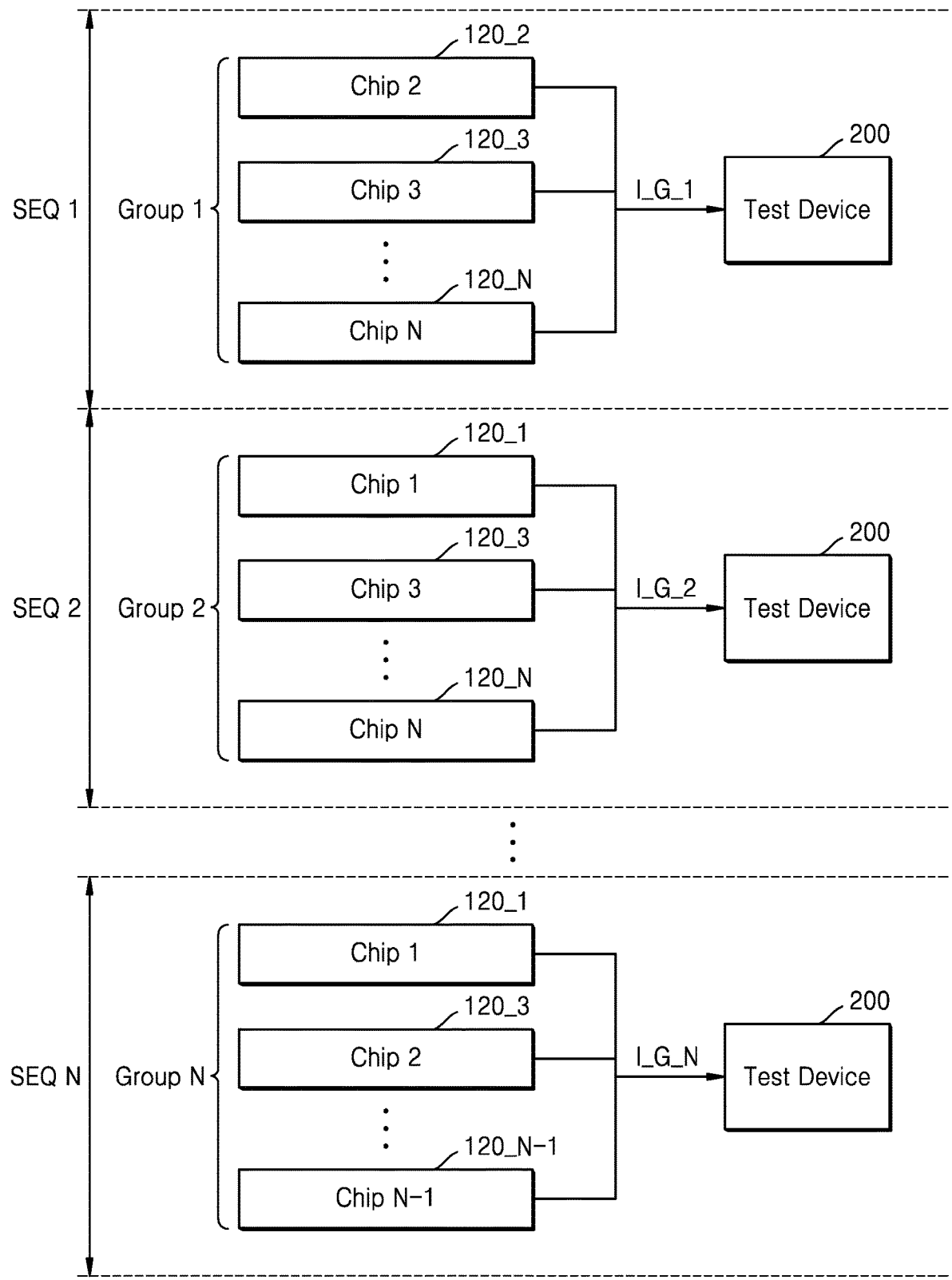
FIG. 7 is a view illustrating an example of a semiconductor package test method, according to an exemplary embodiment of the inventive concept.

FIG. 7 is a view illustrating an example of a semiconductor package test method according to an exemplary embodiment of the inventive concept. In particular, FIG. 7 is a view illustrating an example embodiment in which N semiconductor chips share one channel in a semiconductor package. In particular, FIG. 7 is a view illustrating an example embodiment in which an electrical signal is a current among the previously described embodiments. However, the inventive concept is not limited thereto. FIG. 7 is described with reference to FIGS. 1 and 4.

The test device 200 may test the semiconductor package 100 through the plurality of operation sequences. For example, the test device 200 may perform operations of first to Nth operation sequences SEQ 1 to SEQ N. In an ith operation sequence (in this example, i is a natural number of no less than 1 and no more than N), the test device 200 may sense a group current output from an ith semiconductor chip group. Here, the ith semiconductor chip group may include semiconductor chips excluding an ith semiconductor chip among the plurality of semiconductor chips 120_1 to 120_N. For example, each of the semiconductor groups Group 1 to Group N may include all but one of the semiconductor chips 120_1 to 120_N.

In a detailed example, in the first operation sequence SEQ 1, the semiconductor package 100 may output a first group current I_G_1 that is the sum of currents output from semiconductor chips included in the first semiconductor chip group Group 1. The first semiconductor chip group Group 1 may include semiconductor chips excluding the first semiconductor chip 120_1 among the plurality of semiconductor chips, for example, the second to Nth semiconductor chips 120_2 to 120_N.

In the second operation sequence SEQ 2, the semiconductor package 100 may output a second group current I_G_2 that is the sum of currents output from semiconductor chips included in the second semiconductor chip group Group 2. The second semiconductor chip group Group 2 may include semiconductor chips excluding the second semiconductor chip 120_2 among the plurality of semiconductor chips, for example, the first semiconductor chip 120_1 and the third to Nth semiconductor chips 120_3 to 120_N.

In the Nth operation sequence SEQ N, the semiconductor package 100 may output an Nth group current I_G_N that is the sum of currents output from semiconductor chips included in an Nth semiconductor chip group Group N. The Nth semiconductor chip group Group N may include semiconductor chips excluding the Nth semiconductor chip 120_N among the plurality of semiconductor chips, for example, the first to (N−1)th semiconductor chips 120_1 to 120_N−1.

The test device 200 may obtain the chip currents output from the plurality of semiconductor chips 120 by obtaining the solution of the simultaneous equation determined based on the first to Nth group currents I_G_1 to I_G_N and the semiconductor chip combinations included in the semiconductor chip groups. For example, the test device 200 may obtain the plurality of chip currents by obtaining the solution of the simultaneous equation such as the following [EQUATION 5].

$$I\_c\_2 + I\_c\_3 + \ldots + I\_c\_N = I\_G\_1$$

$$I\_c\_1 + I\_c\_3 + \ldots + I\_c\_N = I\_G\_2$$

$$I\_c\_1 + I\_c\_2 + \ldots + I\_c\_N{-}1 = I\_G\_N \qquad \text{[EQUATION 5]}$$

FIG. 8 illustrates the arithmetic circuit 240 according to an exemplary embodiment of the inventive concept. The arithmetic circuit 240 may correspond to the arithmetic circuit 240 of FIG. 4.

The arithmetic circuit 240 may include an inverse matrix generation circuit 242 and a matrix multiplication circuit 244.

In an example embodiment, the arithmetic circuit 240 illustrated in FIG. 8 may calculate the chip currents output from the plurality of semiconductor chips 120 by obtaining a solution X of a matrix equation such as [EQUATION 6]. In [EQUATION 6], CM may represent a coefficient matrix, X may represent a vector formed of a plurality of chip currents, and A may represent a vector including a plurality of group currents. Here, a vector may represent a matrix including a column.

$$CM \times X = A \qquad \text{[EQUATION 6]}$$

The coefficient matrix CM may be determined based on the semiconductor chip combinations included in the plurality of semiconductor chip groups. In an example embodiment, each of elements included in the coefficient matrix CM may have a value of 0 or 1. For example, elements included in a first row of the coefficient matrix CM may be determined in accordance with semiconductor chip combinations included in the first semiconductor chip group. As a non-limiting example, when the first semiconductor chip group includes the first semiconductor chip and the second semiconductor chip, the first row a_11, a_12, a_13, . . . , and a_1N of the coefficient matrix CM may be 1, 1, 0, . . . , and 0. Elements included in a second row of the coefficient matrix CM may be determined in accordance with semiconductor chip combinations included in the second semiconductor chip group. As a non-limiting example, when the second semiconductor chip group includes the second semiconductor chip and the Nth semiconductor chip, the second row a_21, a_22, a_23, . . . , and a_2N of the coefficient matrix CM may be 0, 1, 0, . . . , and 1. Elements included in an Nth row of the coefficient matrix CM may be determined in accordance with semiconductor chip combinations included in the Nth semiconductor chip group. As a non-limiting example, when the Nth semiconductor chip group includes the first semiconductor chip and the Nth semiconductor chip, the Nth row a_N1, a_N2, a_N3, . . . , a_NN of the coefficient matrix CM may be 1, 0, 0, . . . , 1.

The inverse matrix generation circuit 242 may generate an inverse coefficient matrix (ICM) that is an inverse matrix of the coefficient matrix CM based on the semiconductor chip combinations included in the plurality of semiconductor chip groups. The inverse matrix generation circuit 242 may provide the ICM to the matrix multiplication circuit 244.

The matrix multiplication circuit 244 may form the matrix A by using the first to Nth group currents I_G_1 to I_G_N and may obtain the matrix X by performing an operation of multiplying the ICM by the matrix A. The matrix multiplication circuit 244 may obtain the plurality of chip currents by obtaining the matrix X.

Figure 9:
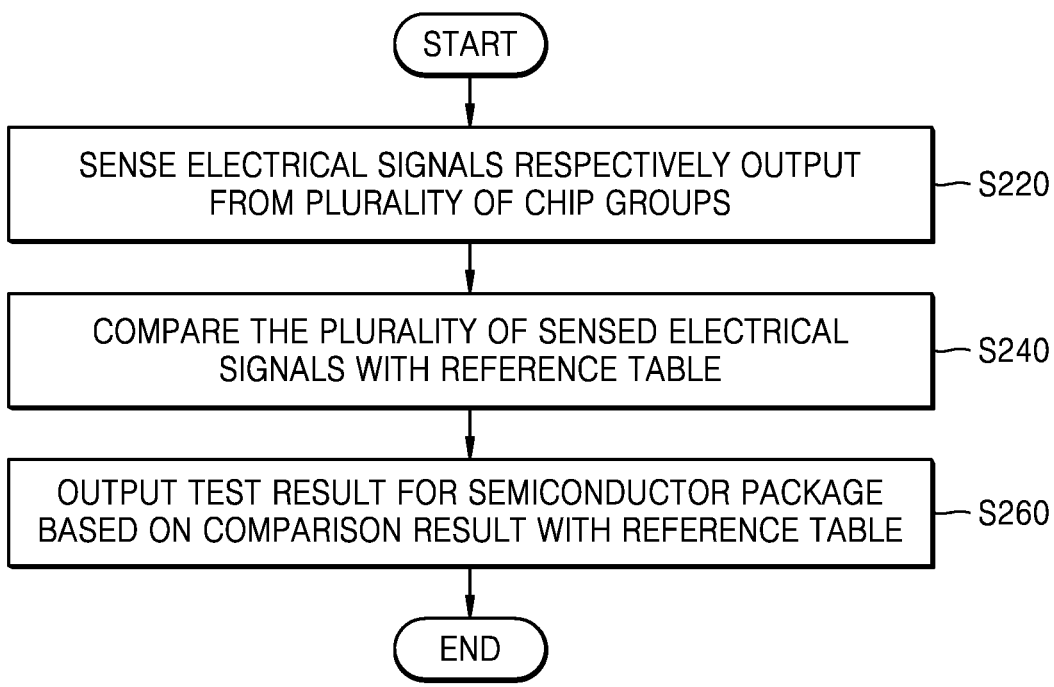
FIG. 9 is a flowchart of a semiconductor package test method, according to an exemplary embodiment of the inventive concept.

FIG. 9 is a flowchart of a semiconductor package test method according to an exemplary embodiment of the inventive concept. FIG. 9 is described with reference to FIG. 1.

The test device 200 may sense the electrical signals respectively output from the plurality of semiconductor chip groups of the semiconductor package 100 in operation S220. Because operation S220 is the same as operation S120 described with reference to FIG. 2, detailed description thereof is replaced by the description of operation S120.

The test device 200 may compare the plurality of sensed electrical signals with the reference table in operation S240. The reference table may include reference values corresponding to the plurality of semiconductor chip combinations. The reference table will be described in more detail with reference to FIG. 11. In an example embodiment, the test device 200 may determine the semiconductor chip combinations corresponding to the first semiconductor chip group and may select a first reference value corresponding to the determined semiconductor chip combinations from the reference table. The test device 200 may compare the electrical signal sensed in the first operation sequence with the first reference value. The comparison operation may be repeatedly performed on the plurality of operation sequences.

The test device 200 may output the test result RST_T for the semiconductor package 100 based on the comparison result with the reference table in operation S260. For example, in the case in which the sensed electrical signal has an error of no less than (e.g., equal to or greater than) a predetermined ratio when it is compared with the first reference value, the test device 200 may output the test result RST_T representing that the semiconductor package 100 is defective.

Figure 10:
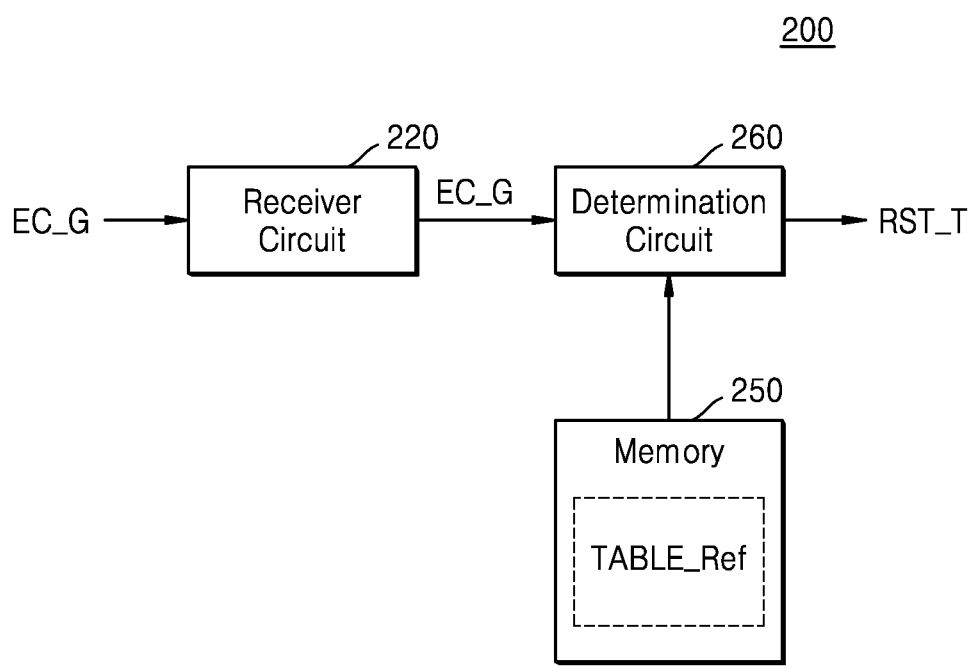
FIG. 10 illustrates a test device, according to an exemplary embodiment of the inventive concept.

FIG. 10 illustrates the test device 200 according to an exemplary embodiment of the inventive concept. FIG. 10 is described with reference to FIG. 1.

The test device 200 may include the receiver circuit 220, a memory 250, and the determination circuit 260.

The receiver circuit 220 may receive the group electrical signal EC_G from the outside of the test device 200. For example, the receiver circuit 220 may receive the group electrical signal EC_G from the semiconductor package 100 and may transmit the group electrical signal EC_G to the arithmetic circuit 240. The receiver circuit 220 may be implemented by one of various forms of an interface receiving the group electrical signal EC_G.

The memory 250 may be a storage unit storing data may store various programs and data items. The memory 250 may include at least one of volatile memory and non-volatile memory. The non-volatile memory may be read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), or ferroelectric RAM (FRAM). The volatile memory may be dynamic RAM (DRAM), static RAM (SRAM), synchronous DRAM (SDRAM), PRAM, MRAM, RRAM, or FeRAM. In addition, in an example embodiment, the memory 250 may include at least one of a hard disk drive (HDD), a solid state drive (SSD), a compact flash (CF) memory, a secure digital (SD) memory, a micro secure digital (micro-SD) memory, a mini secure digital (mini-SD) memory, an extreme digital (xD) memory, and a memory stick. The memory 250 may store the reference table TABLE_Ref. The memory 250 may provide the reference table TABLE_Ref to the determination circuit 260.

The determination circuit 260 may output the test result RST_T by comparing the group electrical signal EC_G with the reference table TABLE_Ref.

FIG. 11 illustrates the reference table TABLE_Ref according to an exemplary embodiment of the inventive concept. The reference table TABLE_Ref of FIG. 11 may correspond to the reference table TABLE_Ref of FIG. 10.

The reference table TABLE_Ref may include reference values respectively corresponding to the plurality of semiconductor chip combinations. For example, the reference table TABLE_Ref may include a first reference value RV_1 corresponding to a first semiconductor chip combination Comb_1, a second reference value RV_2 corresponding to a second semiconductor chip combination Comb_2, and an Mth reference value RV_M corresponding to an Mth semiconductor chip combination Comb_M (M is a natural number of no less than 2). Here, a semiconductor chip combination may include at least parts of combinations that may be formed of at least two semiconductor chips 120 among the plurality of semiconductor chips 120.

As a non-limiting example, the first semiconductor chip combination Comb_1 may be formed of the first semiconductor chip 120_1 and the second semiconductor chip 120_2, the second semiconductor chip combination Comb_2 may be formed of the second semiconductor chip 120_2 and the third semiconductor chip 120_3, and the Mth semiconductor chip combination Comb_M may be formed of the Nth semiconductor chip 120_N and the first semiconductor chip 120_1.

With reference to FIG. 10 together with FIG. 11, an operation of the determination circuit 260 comparing the group electrical signal EC_G with the reference table TABLE_Ref will be described in more detail. The determination circuit 260 may determine semiconductor chip combinations included in a semiconductor chip group corresponding to a current operation sequence. The determination circuit 260 may determine a corresponding semiconductor chip combination in the reference table TABLE_Ref by comparing the determined semiconductor chip combinations with the reference table TABLE_Ref. The determination circuit 260 may select a reference value corresponding to the determined semiconductor chip combination. The determination circuit 260 may compare the group electrical signal EC_G with the selected reference value. When an error between an amplitude of the group electrical signal EC_G and the selected reference value deviates from a predetermined range, the determination circuit 260 may determine that the semiconductor package is defective. When the error between the amplitude of the group electrical signal EC_G and the selected reference value is within the predetermined range, the determination circuit 260 may determine that the semiconductor package is not defective.

FIG. 12 is a flowchart of a semiconductor package test method according to an exemplary embodiment of the inventive concept. FIG. 12 is described with reference to FIG. 1.

The test device 200 may provide the CER command instructing that the at least two semiconductor chips 120 among the plurality of semiconductor chips 120 be simultaneously activated to the semiconductor package 100 in operation S320.

The test device 200 may provide address signals corresponding to semiconductor chips 120 included in a semiconductor chip group corresponding to a corresponding operation sequence in the plurality of operation sequences to the semiconductor package 100 in operation S340. For example, in the example embodiment of FIG. 5, in the first operation sequence SEQ1, the test device 200 may provide an address signal corresponding to the second semiconductor chip 120_2 and an address signal corresponding to the third semiconductor chip 120_3 to the semiconductor package 100 subsequent to the CER command.

The test device 200 may sense electrical signals output from the semiconductor chips 120 included in the semiconductor chip group corresponding to the corresponding operation sequence in the plurality of operation sequences in operation S360. Then, the semiconductor package 100 described with reference to FIG. 2 or 9 may be tested.

Figure 13:
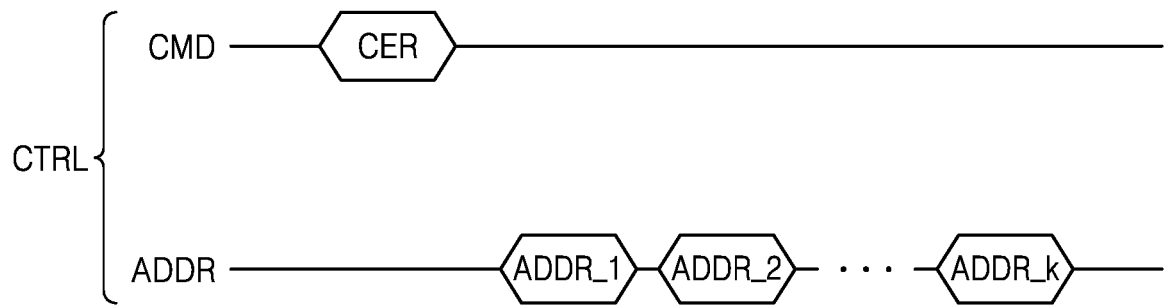
FIG. 13 is a timing diagram of a control signal, according to an exemplary embodiment of the inventive concept.

FIG. 13 is a timing diagram of the control signal CTRL according to an exemplary embodiment of the inventive concept. In an embodiment, the control signal CTRL may include a command CMD and an address signal ADDR.

The test device 200 according to an exemplary embodiment of the inventive concept may provide the CER command simultaneously activating the at least two semiconductor chips 120 to the semiconductor package 100. Then, the test device 200 may provide address signals corresponding to semiconductor chips 120 to be activated to the semiconductor package 100.

For example, the test device 200 may provide first to kth address signals ADDR_1 to ADDR_k (k is a natural number of no less than 2) to the semiconductor package 100.

The semiconductor package 100 may simultaneously activate the plurality of semiconductor chips 120 based on the CER command and the plurality of address signals that are received from the test device 200. For this purpose, the semiconductor package 100 may include a control circuit activating a semiconductor chip 120 by processing the control signal CTRL, which will be described with reference to FIG. 14.

Figure 14:
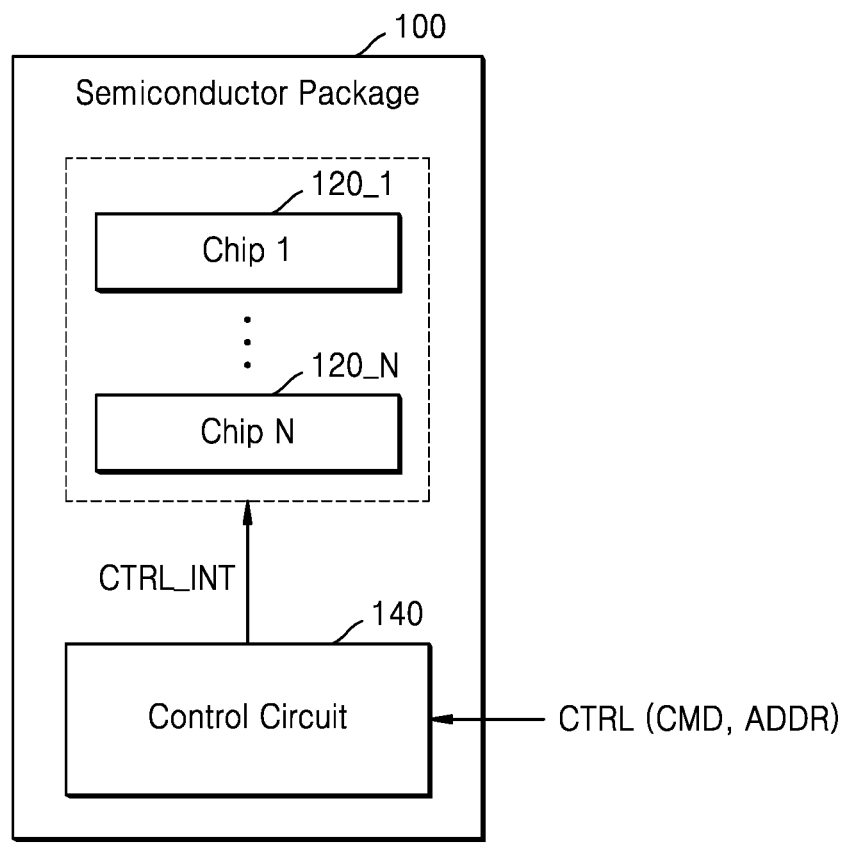
FIG. 14 illustrates a semiconductor package, according to an exemplary embodiment of the inventive concept.

FIG. 14 illustrates the semiconductor package 100 according to an exemplary embodiment of the inventive concept. The semiconductor package 100 may correspond to the semiconductor package 100 of FIG. 1. FIG. 14 is described with reference to FIG. 1.

The semiconductor package 100 may include a plurality of semiconductor chips 120 and a control circuit 140. The plurality of semiconductor chips 120 may include the first to Nth semiconductor chips 120_1 to 120_N.

The control circuit 140 may control an overall operation of the semiconductor package 100 and may be implemented by, for example, a processor such as a central processing unit (CPU). The control circuit 140 may control various functions of the semiconductor package 100 by processing or executing programs and/or data items.

The control circuit 140 according to an exemplary embodiment of the inventive concept may generate an internal control signal CTRL_INT controlling the plurality of semiconductor chips 120 by decoding the control signal CTRL received from the test device 200. For example, the control circuit 140 may control the plurality of semiconductor chips 120 based on the command CMD and the address signal ADDR. In an example embodiment, in response to the plurality of address signals subsequent to the CER command, the control circuit 140 may provide the internal control signal CTRL_INT to the plurality of semiconductor chips 120 so as to activate semiconductor chips 120 respectively corresponding to a plurality of received addresses among the plurality of semiconductor chips 120. Therefore, the control circuit 140 may activate at least two semiconductor chips 120 among the plurality of semiconductor chips 120 and the activated semiconductor chips 120 may provide the group electrical signal (EC_G of FIG. 1) to the test device 200.

Figure 15:
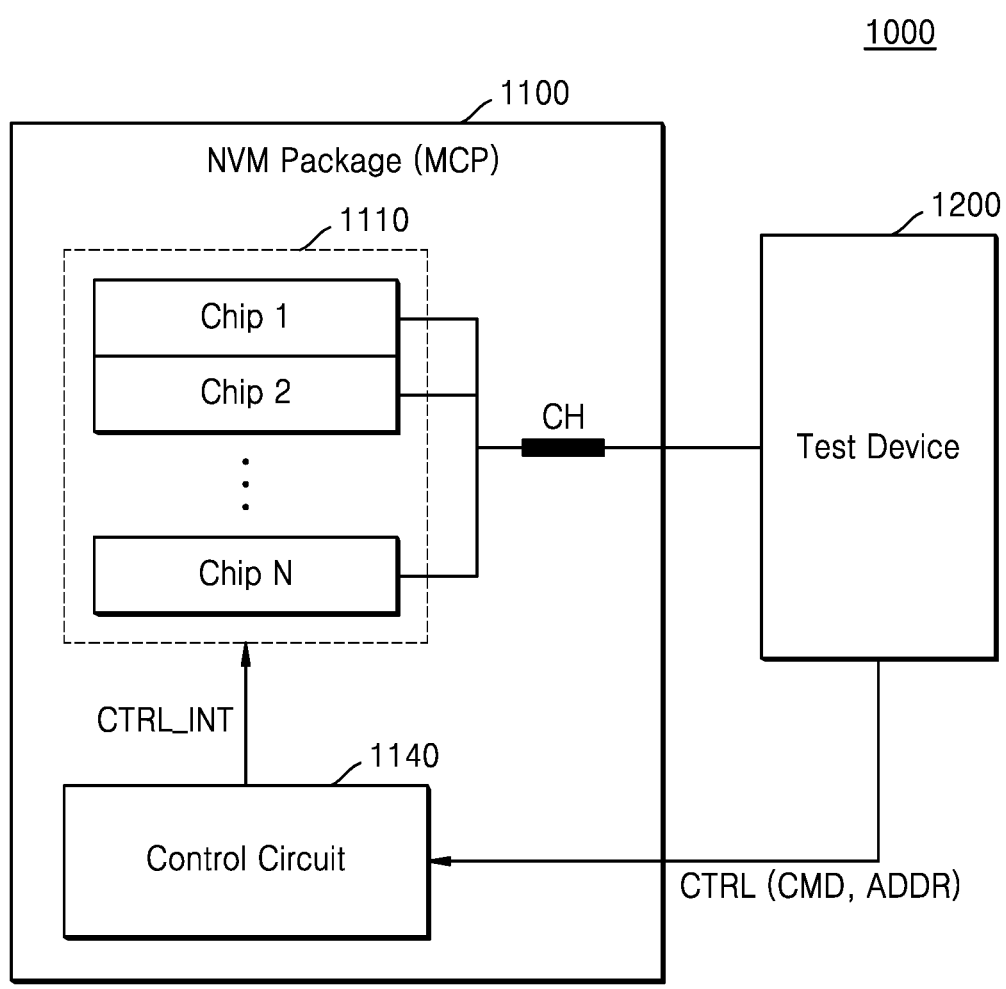
FIG. 15 illustrates a non-volatile memory package test system, according to an exemplary embodiment of the inventive concept.

FIG. 15 illustrates a non-volatile memory package test system 1000 according to an exemplary embodiment of the inventive concept. The non-volatile memory package test system 1000 may include a non-volatile memory package 1100 and a test device 1200. Here, the semiconductor package test system 10 described with reference to FIGS. 1 to 14 may be applied to the non-volatile memory package test system 1000. At this time, the non-volatile memory package 1100 may correspond to the semiconductor package 100 described with reference to FIGS. 1 to 14 and the test device 1200 may correspond to the test device 200 described with reference to FIGS. 1 to 14.

The non-volatile memory package 1100 may be implemented by using one of various forms of packages. For example, the non-volatile memory package 1100 may be implemented by using a package such as a package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flatpack (TQFP), a small outline integrated circuit (SOIC), a shrink small outline package (SSOP), a thin small outline package (TSOP), a thin quad flatpack (TQFP), a system in package (SIP), a multichip package (MCP), a wafer-level fabricated package (WFP), or a wafer-level processed stack package (WSP). In an embodiment, the non-volatile memory package 1100 may be implemented by a multichip package. The multichip package will be described in more detail with reference to FIG. 16.

A plurality of non-volatile memory chips 1110 may share one channel CH. The plurality of non-volatile memory chips 1110 may correspond to the semiconductor chips 120 described with reference to FIGS. 1 to 14.

The test device 1200 may provide the control signal CTRL including the command CMD and the address signal ADDR to a control circuit 1140. For example, the test device 1200 may provide the plurality of address signals subsequent to the CER command to the control circuit 1140. The control circuit 1140 may provide the internal control signal CTRL_INT to the plurality of non-volatile memory chips 1110 so as to activate at least two non-volatile memory chips among the plurality of non-volatile memory chips 1110 in response to the CER command and the plurality of address signals. The at least two activated non-volatile memory chips may output an electrical signal (for example, a current) through the shared channel CH.

Because the example embodiments described with reference to FIGS. 1 to 14 may also be applied to the non-volatile package test system 1000 of FIG. 15, previously given description is omitted.

Figure 16:
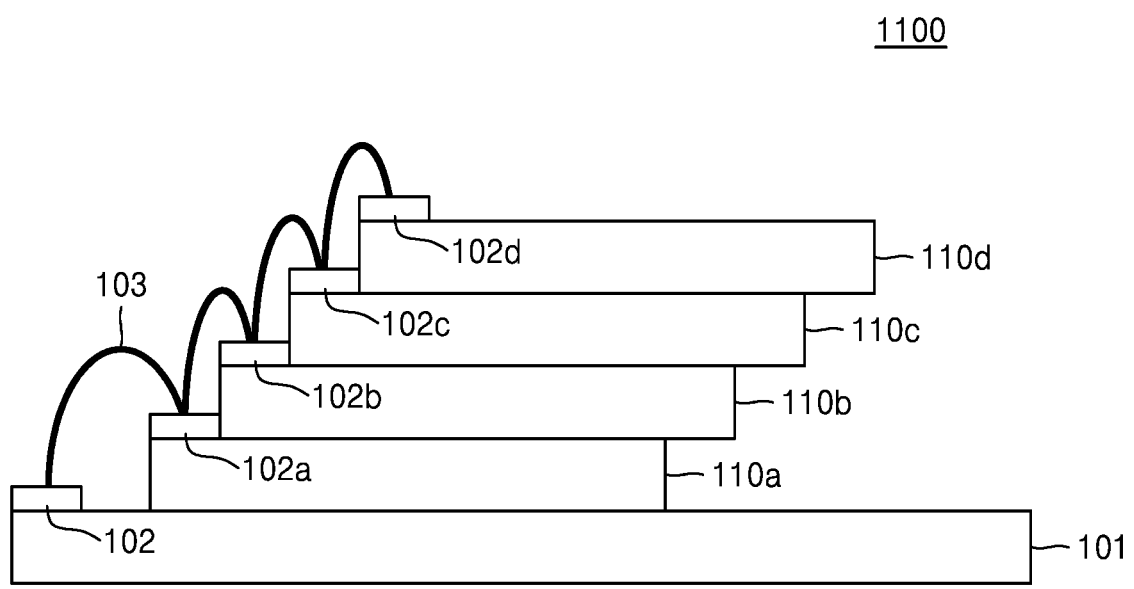
FIG. 16 illustrates a non-volatile memory package implemented by a multichip package, according to an exemplary embodiment of the inventive concept.

FIG. 16 illustrates the non-volatile memory package 1100 implemented by a multichip package according to an exemplary embodiment of the inventive concept. The non-volatile memory package 1100 of FIG. 16 may correspond to the non-volatile memory package 1100 of FIG. 15.

The non-volatile memory package 1100 may include a substrate 101 and non-volatile memory chips 110a, 110b, 110c, and 110d. The non-volatile memory chips 110a, 110b, 110c, and 110d may respectively correspond to the semiconductor chips 120 described with reference to FIGS. 1 to 14. On the substrate 101, a substrate pad 102 may be provided. The substrate pad 102 may be connected to the non-volatile memory chips 110a, 110b, 110c, and 110d through wiring lines 103. The substrate 101 may include internal or external wiring lines connecting the substrate pad 102 to an external device.

The non-volatile memory chips 110a, 110b, 110c, and 110d may respectively include pads 102a, 102b, 102c, and 102d. The pads 102a, 102b, 102c, and 102d may connect the non-volatile memory chips 110a, 110b, 110c, and 110d to the substrate pad 102 through the wiring lines 103.

As described above with reference to the above drawings, the non-volatile memory chips 110a, 110b, 110c, and 110d may share one channel and may output the group electrical signal obtained by summing up the electrical signals output from the at least two non-volatile memory chips selected from the non-volatile memory chips 110a, 110b, 110c, and 110d in response to the CER command.

While the inventive concept has been particularly shown and described with reference to embodiments thereof, it will be understood that various changes in form and details may be made therein without departing from the spirit and scope of the following claims.

What is claimed is:

1. A method of testing a semiconductor package including a plurality of semiconductor chips, the method comprising:
sensing a plurality of electrical signals respectively output from a plurality of semiconductor chip groups, each of the plurality of semiconductor chip groups representing a combination of at least two semiconductor chips among the plurality of semiconductor chips;
obtaining amplitudes of the plurality of electrical signals respectively output from the plurality of semiconductor chips based on the plurality of sensed electrical signals; and
outputting a test result for the semiconductor package by using the amplitudes of the plurality of electrical signals.

2. The method of claim 1, wherein a number of the plurality of semiconductor chip groups is the same as a number of the plurality of semiconductor chips.

3. The method of claim 1, wherein the sensing of the electrical signals comprises sensing a sum of currents output from the plurality of semiconductor chips included in the plurality of semiconductor chip groups.

4. The method of claim 1, wherein the obtaining of the amplitudes of the electrical signals comprises obtaining the amplitudes of the electrical signals by obtaining solutions of equations obtained based on the plurality of sensed electrical signals and a combination of semiconductor chips included in the plurality of semiconductor chip groups.

5. The method of claim 1,
wherein the plurality of semiconductor chips comprises first to Nth semiconductor chips, where N is a natural number of no less than 2, and
wherein the sensing of the electrical signals comprises iterative sensing steps including sensing a sum of currents output from semiconductor chips excluding an nth semiconductor chip among the plurality of semiconductor chips as an nth sensing current, where n is a natural number of no less than 1 and no more than N.

6. The method of claim 5, wherein the obtaining of the amplitudes of the electrical signals comprises obtaining a plurality of chip currents respectively output from the plurality of semiconductor chips by performing an operation using first to Nth sensing currents.

7. The method of claim 5, wherein the obtaining of the amplitudes of the electrical signals comprises obtaining a first chip current output from a first semiconductor chip by summing up second to Nth sensing currents and dividing a value obtained by subtracting a first sensing current from a sum of the second to Nth sensing currents by 2.

8. The method of claim 1, wherein the plurality of semiconductor chips share one channel and are connected to the one channel.

9. The method of claim 8, wherein the sensing of the electrical signals comprises:
providing a chip enable reduction (CER) command instructing that at least two first semiconductor chips be simultaneously selected from the plurality of semiconductor chips to the semiconductor package; and
providing address signals corresponding to semiconductor chips respectively included in the plurality of semiconductor chip groups to the semiconductor package.

10. A method of testing a semiconductor package including a plurality of semiconductor chips, the method comprising:
sensing a plurality of electrical signals respectively output from a plurality of semiconductor chip groups, each of the plurality of semiconductor chip groups representing a combination of at least two semiconductor chips among the plurality of semiconductor chips;
obtaining amplitudes of the plurality of electrical signals respectively output from the plurality of semiconductor chips based on the plurality of sensed electrical signals; and
outputting a test result for the semiconductor package by using the amplitudes of the plurality of electrical signals,
wherein the plurality of semiconductor chips comprises first to Nth semiconductor chips, where N is a natural number of no less than 2, and
wherein the sensing of the electrical signals comprises iterative sensing steps including sensing a sum of currents output from semiconductor chips excluding an nth semiconductor chip among the plurality of semiconductor chips as an nth sensing current, where n is a natural number of no less than 1 and no more than N.

11. The method of claim 10, wherein a number of the plurality of semiconductor chip groups is the same as a number of the plurality of semiconductor chips.

12. The method of claim 10, wherein the obtaining of the amplitudes of the electrical signals comprises obtaining the amplitudes of the electrical signals by obtaining solutions of equations obtained based on the plurality of sensed electrical signals and a combination of semiconductor chips included in the plurality of semiconductor chip groups.

13. The method of claim 10, wherein the obtaining of the amplitudes of the electrical signals comprises obtaining a plurality of chip currents respectively output from the plurality of semiconductor chips by performing an operation using first to Nth sensing currents.

14. The method of claim 10, wherein the obtaining of the amplitudes of the electrical signals comprises obtaining a first chip current output from a first semiconductor chip by summing up second to Nth sensing currents and dividing a value obtained by subtracting a first sensing current from a sum of the second to Nth sensing currents by 2.

15. A method of testing a semiconductor package including a plurality of semiconductor chips, the method comprising:

sensing a plurality of electrical signals respectively output from a plurality of semiconductor chip groups, each of the plurality of semiconductor chip groups representing a combination of at least two semiconductor chips among the plurality of semiconductor chips;

obtaining amplitudes of the plurality of electrical signals respectively output from the plurality of semiconductor chips based on the plurality of sensed electrical signals; and outputting a test result for the semiconductor package by using the amplitudes of the plurality of electrical signals, wherein the sensing of the plurality of electrical signals comprises:

providing a chip enable reduction (CER) command instructing that at least two first semiconductor chips be simultaneously selected from the plurality of semiconductor chips to the semiconductor package; and providing address signals corresponding to semiconductor chips respectively included in the plurality of semiconductor chip groups to the semiconductor package.

16. The method of claim 15, wherein a number of the plurality of semiconductor chip groups is the same as a number of the plurality of semiconductor chips.

17. The method of claim 15, wherein the plurality of semiconductor chips share one channel and are connected to the one channel.

* * * * *